(12) United States Patent
Kume et al.

(10) Patent No.: US 10,204,862 B2
(45) Date of Patent: Feb. 12, 2019

(54) METHOD OF MANUFACTURING SEMICONDUCTOR DEVICE, AND SEMICONDUCTOR DEVICE

(71) Applicant: Toshiba Memory Corporation, Tokyo (JP)

(72) Inventors: Ippei Kume, Oita Oita (JP); Kengo Uchida, Oita Oita (JP)

(73) Assignee: Toshiba Memory Corporation, Tokyo (JP)

( * ) Notice: Subject to any disclaimer, the term of this patent is extended or adjusted under 35 U.S.C. 154(b) by 140 days.

(21) Appl. No.: 15/061,659

(22) Filed: Mar. 4, 2016

(65) Prior Publication Data

US 2016/0351503 A1    Dec. 1, 2016

(30) Foreign Application Priority Data

May 29, 2015    (JP) .................. 2015-110789

(51) Int. Cl.
| | |
|---|---|
| *H01L 29/49* | (2006.01) |
| *H01L 23/538* | (2006.01) |
| *H01L 21/768* | (2006.01) |
| *H01L 23/48* | (2006.01) |
| *H01L 21/308* | (2006.01) |

(52) U.S. Cl.
CPC .... *H01L 23/5384* (2013.01); *H01L 21/76898* (2013.01); *H01L 23/481* (2013.01); *H01L 21/3081* (2013.01); *H01L 21/76831* (2013.01); *H01L 2224/11* (2013.01)

(58) Field of Classification Search
CPC ............................ H01L 23/5384; H01L 32/481
See application file for complete search history.

(56) References Cited

U.S. PATENT DOCUMENTS

| | | |
|---|---|---|
| 2009/0108464 A1 | 4/2009 | Uchiyama |
| 2012/0276733 A1 | 11/2012 | Saeki et al. |
| 2015/0054172 A1 | 2/2015 | Shirono et al. |

FOREIGN PATENT DOCUMENTS

| | | |
|---|---|---|
| CN | 104425295 A | 3/2015 |
| JP | 2012-142414 | 7/2012 |
| JP | 2014011309 A | 1/2014 |

(Continued)

OTHER PUBLICATIONS

TW Office Action dated Jul. 25, 2016 for Application No. 104139211.

(Continued)

*Primary Examiner* — Michael Shingleton
(74) *Attorney, Agent, or Firm* — Patterson & Sheridan, LLP (57) ABSTRACT

A semiconductor device includes a semiconductor substrate provided with a through-hole, a device layer including a lower layer wiring, an insulating layer that covers the device layer, a first through-electrode that passes through the insulating layer, a first insulating film provided with an opening having a diameter that is substantially the same as or greater than an opening diameter of the through-hole of the semiconductor substrate, a second insulating film positioned on an upper side of the first insulating film and on an inner side surface of the through-hole of the semiconductor substrate, and a second through-electrode electrically connected to the lower layer wiring in the device layer from an upper side of the second insulating film through the inside of the through-hole of the semiconductor substrate.

7 Claims, 10 Drawing Sheets

(56) References Cited

FOREIGN PATENT DOCUMENTS

| | | |
|---|---|---|
| JP | 2015002299 A | 1/2015 |
| TW | 201508889 A | 3/2015 |

OTHER PUBLICATIONS

Chinese Office Action dated Jul. 23, 2018, filed in Chinese counterpart Application No. 201510848888.9, 13 pages (with translation).

METHOD OF MANUFACTURING SEMICONDUCTOR DEVICE, AND SEMICONDUCTOR DEVICE

CROSS-REFERENCE TO RELATED APPLICATION

This application is based upon and claims the benefit of priority from Japanese Patent Application No. 2015-110789, filed May 29, 2015, the entire contents of which are incorporated herein by reference.

FIELD

Embodiments described herein relate generally to a method of manufacturing a semiconductor device, and a semiconductor device.

BACKGROUND

Recently, integrating a semiconductor device using through-silicon vias (TSV) to easily stack and interconnect a plurality of semiconductor device chips into a single device has attracted attention from the viewpoints of high functionality and the like.

In the integration technology using the TSV, reliability of a through-electrode (hereinafter, referred to as a TSV electrode) that is formed in the TSV is very important. However, the TSV has a high aspect ratio, and thus it is difficult to bury a metal and the like in the opening and thereby form a consistently reliable TSV.

DETAILED DESCRIPTION

An object of an exemplary embodiment is to provide a method of manufacturing a semiconductor device which is capable of reliably embedding a metal and the like in an opening to form a TSV, and a resulting semiconductor device.

In general, according to one embodiment, a semiconductor device may include a semiconductor substrate provided with a through-hole that passes through the semiconductor substrate from a first surface to a second, opposed surface; a device layer positioned on the first surface of the semiconductor substrate including a wiring; an insulating layer that covers the device layer; a first through-electrode that passes through the insulating layer; a first insulating film positioned on the second surface of the semiconductor substrate, and is provided with an opening having an opening diameter that is substantially the same as or greater than an opening diameter of the through-hole of the semiconductor substrate; a second insulating film positioned on the first insulating film and on an inner side surface of the through-hole of the semiconductor substrate; and a second through-electrode electrically connected to the wiring in the device layer from an upper side of the second insulating film through the inside of the through-hole of the semiconductor substrate.

Hereinafter, a semiconductor device and a method of manufacturing the semiconductor device according to an embodiment will be described in detail with reference to the accompanying drawings. However, the disclosure is not limited by the embodiment. In addition, in the following description, an element forming surface in a semiconductor substrate, on which an element is to be formed, is set as a first surface, and a surface on the opposed side of the semiconductor substrate is set as a second surface.

Figure 1:
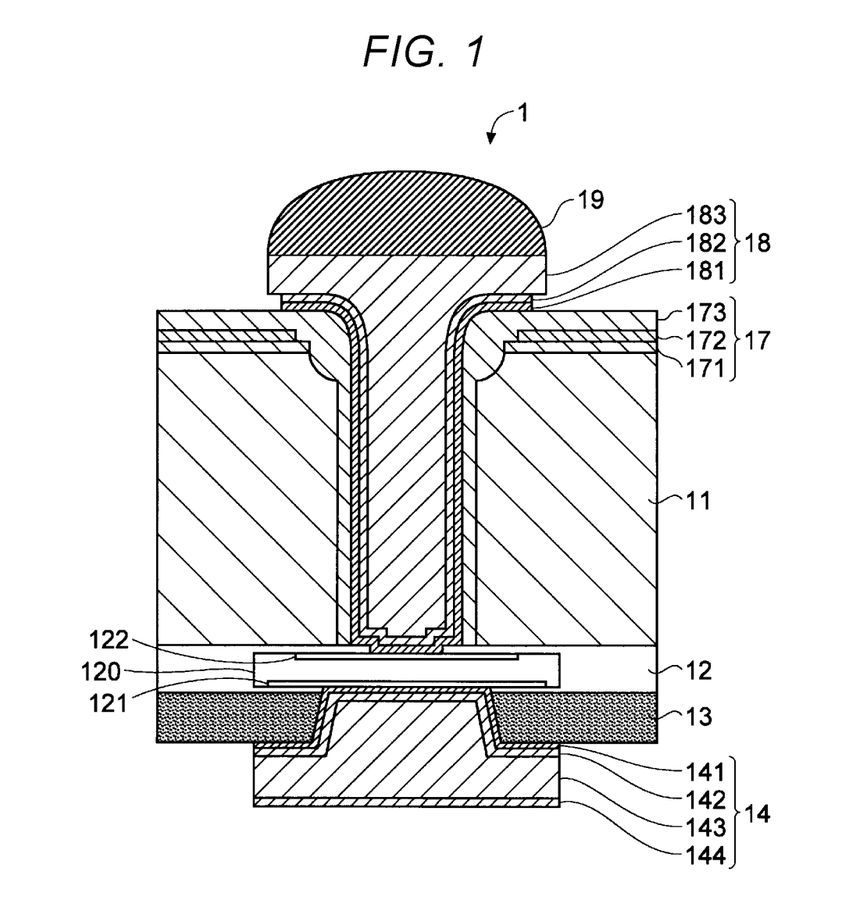
FIG. 1 is a cross-sectional view illustrating a schematic configuration example of a semiconductor device according to an embodiment.

FIG. 1 is a cross-sectional view illustrating a schematic configuration example of the semiconductor device according to the embodiment. As illustrated in FIG. 1, a semiconductor device 1 includes a semiconductor substrate 11, a device layer 12, an insulating layer 13, a first through-electrode 14, an insulating layer 17, a second through-electrode 18, and a joining material 19.

For example, the semiconductor substrate 11 may be a silicon substrate. The semiconductor substrate 11 may be thinned to 50 µm or less, for example, approximately 30±5 µm.

The device layer 12 has an element structure formed on a first surface side of the semiconductor substrate 11, the first surface being an element forming surface, and an interlayer insulating film that buries the element structure therein. The interlayer insulating film may be a silicon oxide film ($SiO_2$). The element structure includes a wiring layer 120. The wiring layer 120 includes an upper layer wiring 121 that is formed at an upper layer, and a lower layer wiring 122 that is formed at a lower layer. Further, the upper layer and the lower layer of the device layer 12 may be an upper layer and a lower layer with the element forming surface of the semiconductor substrate 11 set as a reference.

The insulating layer 13 covers the device layer 12 to protect the device layer 12. The insulating layer 13 may include a passivation layer that covers the device layer 12, and an organic layer that covers the passivation layer. The passivation layer may be a single-layer film of a silicon nitride film (SiN), a silicon oxide film ($SiO_2$), or a silicon oxynitride (SiON), or a stacked film of two or more thereof. A resin material such as a photosensitive polyimide may be used for the organic layer.

The first through-electrode 14 is provided in a through-hole that passes through the insulating layer 13 and extends to the upper layer wiring 121 in the device layer 12, and comes into contact with the upper layer wiring 121, thereby electrically connecting to the upper layer wiring 121 through the insulating layer 13. The first through-electrode 14 may include at least a barrier metal layer 141 that covers a surface in the through-hole, a seed metal layer 142 located on the barrier metal layer 141, and a through-electrode 143 on the seed metal layer 142. The barrier metal layer 141 may be omitted. A material film 144, which functions during integration of the semiconductor device 1 in a vertical direction, may be provided on the through-electrode 143.

Titanium (Ti), tantalum (Ta), ruthenium (Ru), and the like may be used for the barrier metal layer 141. Copper (Cu), a stacked film (Ni/Cu) of nickel and copper, and the like may be used for the seed metal layer 142. Nickel (Ni) and the like may be used for the through-electrode 143. Gold (Au), tin (Sn), copper (Cu), tin-copper (SnCu), tin-gold (SnAu), Tin-silver (SnAg), and the like may be used for the material film 144. However, the layer structure and the material of the first through-electrode 14 may be appropriately changed in accordance with the desired purpose. For example, the layer structure or the material of the barrier metal layer 141, the seed metal layer 142, or the material film 144 may be appropriately changed for compatibility with a conductive material that is used for the through-electrode 143, or a forming method thereof.

The second through-electrode 18 is provided in a through-hole (TSV) that passes through the semiconductor substrate 11 and extends to the lower layer wiring 122 in the device layer 12, and comes into contact with the lower layer wiring 122, thereby electrically providing an exterior connection of the lower layer wiring 122 on the second surface of the semiconductor substrate 11.

As is the case with the first through-electrode 14, the second through-electrode 18 may include at least a barrier metal layer (first metal layer) 181 that covers a surface in the through-hole, a seed metal layer (second metal layer) 182 on the barrier metal layer 181, and a through-electrode (third metal layer) 183 on the seed metal layer 182. Metal materials which are used for the respective components may be the same as those for the barrier metal layer 141, the seed metal layer 142, and the through-electrode 143 of the first through-electrode 14. A cavity may be formed in the through-electrode 183. In addition, a joining material 19, which is used to join semiconductor devices 1 during integration of the plurality of the semiconductor devices 1 in a vertical direction (thickness direction of the semiconductor substrate 11), may be provided on the through-electrode 183. Solder such as tin (Sn), copper (Cu), tin-copper (SnCu), tin-gold (SnAu), and tin-silver (SnAg) may be used for the joining material 19.

An insulating layer 17, which prevents the second through-electrode 18 and the semiconductor substrate 11 from being short-circuited to one another, is provided on an inner side surface of the through-hole that is formed in the semiconductor substrate 11, and on the second surface of the semiconductor substrate 11. The insulating layer 17 may include a silicon oxide film (SiO$_2$) 171 that is positioned on the second surface of the semiconductor substrate 11, a silicon nitride film (SiN) 172 that is positioned on the silicon oxide film 171, and a silicon oxide film 173 that is positioned on the silicon nitride film 172 and on an inner side surface of the through-hole (TSV). The silicon oxide film 171 and/or the silicon nitride film 172 may be referred to as a first insulating film. In addition, the silicon oxide film 173 may be referred to as a second insulating film.

Here, at least one of the silicon oxide film 171 and the silicon nitride film 172 in the insulating layer 17, and the barrier metal layer 181 and/or the seed metal layer 182 overlap each other in the thickness direction of the semiconductor substrate 11. According to this configuration, diffusion of nickel (Ni), copper (Cu), and gold (Au), which are materials of the second through-electrode 18 and the like, into the semiconductor substrate 11 is reduced.

Then, a method of manufacturing the semiconductor device 1 according to this embodiment will be described below in detail with reference to the accompanying drawings. FIGS. 2 to 10 are process cross-sectional views illustrating the method of manufacturing a semiconductor device according to this embodiment. In FIGS. 2 to 10, the description will be made using the same cross-section as in FIG. 1. Further, in FIG. 2, an upper and lower relationship of the cross-section is inverted from an upper and lower relationship in FIG. 1 and FIGS. 3 to 10 for ease of explanation.

Figure 2:
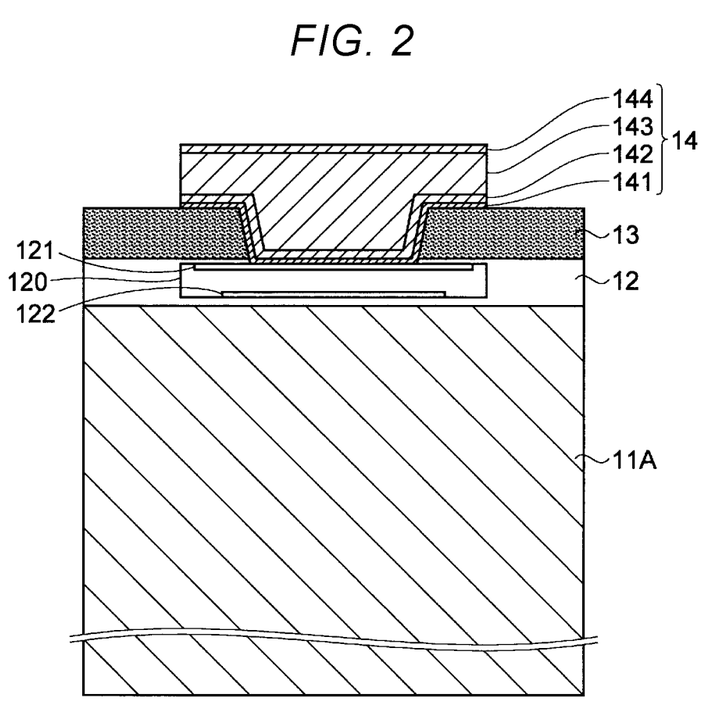
FIG. 2 is a process cross-sectional view (Part 1 thereof) illustrating a method of manufacturing the semiconductor device according to this embodiment.

First, in this embodiment, an element structure is formed on the element forming surface (first surface) of the semiconductor substrate 11, and the thus formed element structure is covered with an interlayer insulating film. Accordingly the device layer 12 is formed. Further, the interlayer insulating film may include various insulating films such as a so-called element isolation insulating film, or various layers such as a wiring layer. In addition, the insulating layer 13 is formed on the device layer 12. As described above, the insulating layer 13 may include the passivation layer that covers the device layer 12, and the organic layer that covers the passivation layer. A photosensitive polyimide and the like may be used for the organic layer, and an opening pattern for formation of the first trough-electrode 14 is transferred to the organic layer. For example, an opening diameter of the opening pattern may be approximately 10 μm.

Next, the passivation layer of the insulating layer 13, and a portion of the device layer 12 on an upper side of the interlayer insulating film are etched with using the organic layer as a mask, thereby exposing the upper layer wiring 121 of the device layer 12. Reactive ion etching (RIE) and the like may be used during etching of the passivation layer and the interlayer insulating film. Then, a barrier metal layer using titanium (Ti) and a seed metal layer using copper (Cu) are sequentially stacked on the entirety of the insulating layer 13 and on an inner surface of the through-hole. When forming the barrier metal layer and the seed metal layer, a sputtering method, a chemical vapor deposition (CVD) method, and the like may be used, respectively. For example, the film thickness of the seed metal layer may be, for example, approximately 500 nm.

Next, a mask for formation of the through-electrode 143 on the seed metal layer is formed using, for example, a photo engraving process (PEP) technology. An opening is formed in advance at a position of the mask which corresponds to the through-hole that is formed in the insulating layer 13. Then, the through-electrode 143 using nickel (Ni) is formed on the seed metal layer that is exposed from the opening of the mask. Conformal plating and the like may be used for formation of the through-electrode 143.

Next, after removal of the mask, the exposed portions of the seed metal layer and the barrier metal layer are removed. Accordingly, the seed metal layer 142 and the barrier metal layer 141 under the through-electrode 143 remain, but the portions thereof extending between the through electrode(s) 143 are removed. Further, wet-etching may be used for patterning of, i.e., removal of, the seed metal layer 142 and the barrier metal layer 141.

Next, the material film 144 using gold (Au) is formed on an upper surface of the through-electrode 143 that is formed. A forming method such as lift-off may be used for formation of the material film 144. As a result, as illustrated in FIG. 2, the first through-electrode 14, which extends out from the upper layer wiring 121 of the device layer 12 onto the insulating layer 13, is formed on an element forming surface (first surface) side of the semiconductor substrate 11.

Figure 3:
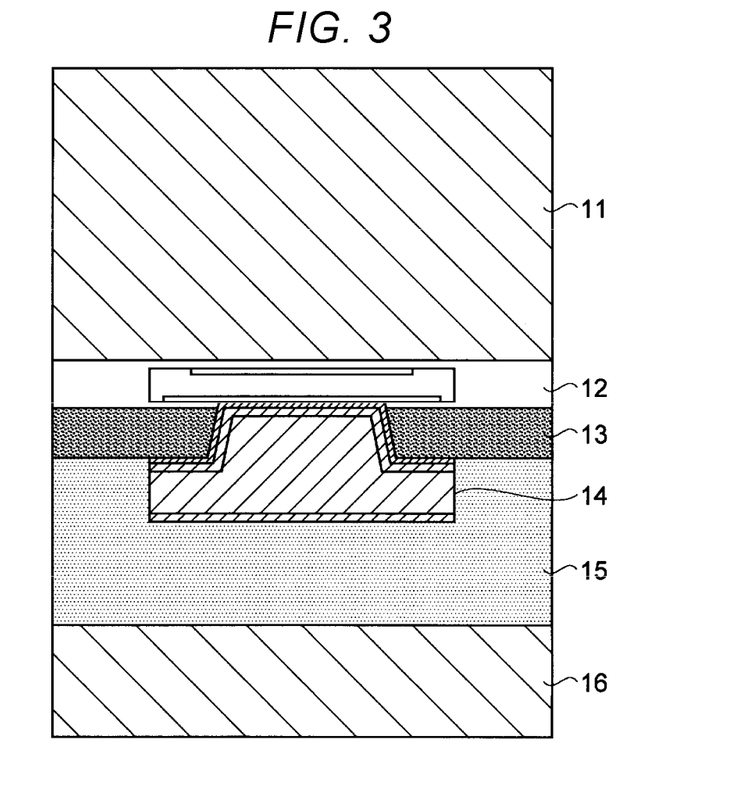
FIG. 3 is a process cross-sectional view (Part 2 thereof) illustrating the method of manufacturing the semiconductor device according to this embodiment.

Next, an adhesive 15 is applied onto the insulating layer 13 in which the first trough-electrode 14 is formed, and a support substrate 16 is stuck to the adhesive, thereby bonding the support substrate 16 to an element forming surface side of the semiconductor device 1 as illustrated in FIG. 3. Then, in a state in which the support substrate 16 is fixed to a stage, the second surface of the semiconductor substrate 11 is ground away thereby thinning the semiconductor substrate 11, for example, to a thickness of approximately 30±5 μm.

Figure 4:
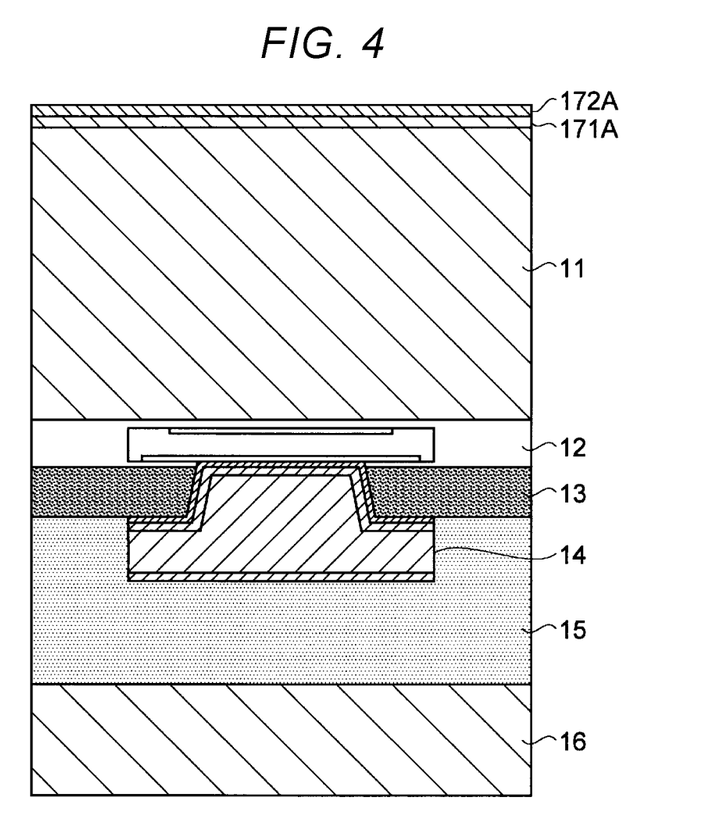
FIG. 4 is a process cross-sectional view (Part 3 thereof) illustrating the method of manufacturing the semiconductor device according to this embodiment.

Next, as illustrated in FIG. 4, a silicon oxide film 171A and a silicon nitride film 172A are sequentially formed on the second surface of the semiconductor substrate 11. The silicon oxide film 171A may be one of various oxide films such as a thermal oxide film that is formed through heating the substrate 11 in an oxygen atmosphere, and a deposited film that is formed by the CVD method. In addition, the silicon nitride film 172A may be various nitride films such as film that is deposited by the CVD method.

Next, a photosensitive photoresist 180M is applied to the silicon nitride film 172A, and an opening pattern for formation of the second through-electrode 18 is transferred to the photoresist 180M. Further, an opening diameter of the opening pattern may be, for example, approximately 10 μm. Then, the semiconductor substrate 11 is etched from the second surface side using the photoresist 180M as a patterned mask, to which the opening pattern is transferred, thereby forming a through-hole (TSV) 180H that reaches the device layer 12. For etching of the semiconductor substrate 11, anisotropic dry etching such as reactive ion etching capable of obtaining a high aspect ratio and the like may be used.

Figure 5:
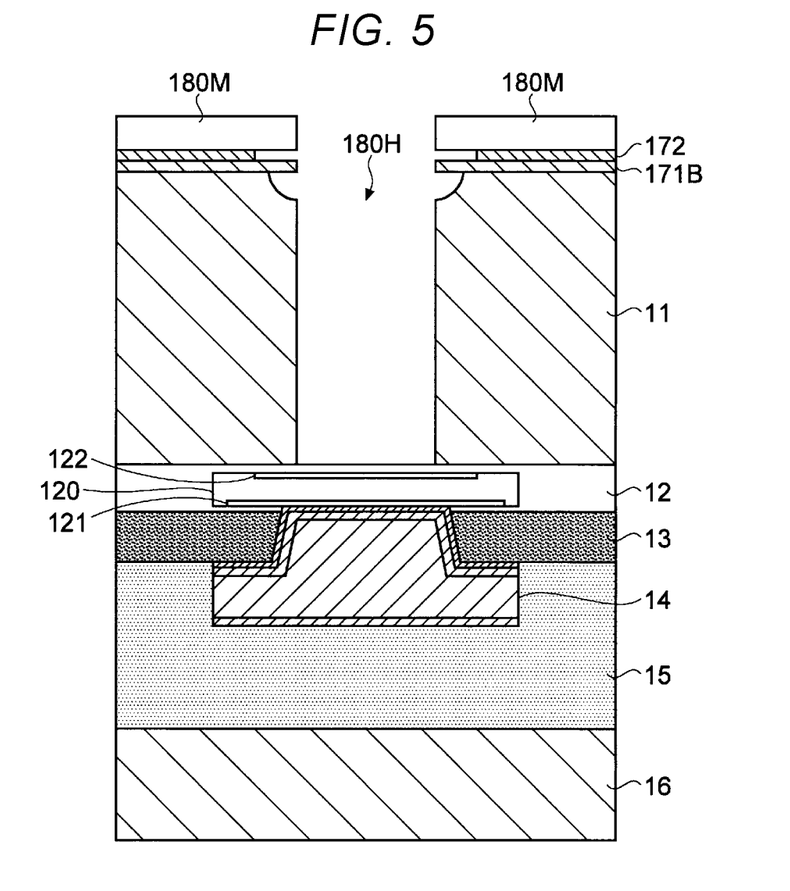
FIG. 5 is a process cross-sectional view (Part 4 thereof) illustrating the method of manufacturing the semiconductor device according to this embodiment.

At this time, when a film such as the silicon oxide film 171A, which has a relatively large etching selectivity with respect to the semiconductor substrate 11, i.e., the silicon oxide film 171A etches slowly as compared to the silicon of the semiconductor substrate 11, is present on the semiconductor substrate 11 that is an etching target, the semiconductor substrate 11 may be further etched in comparison to the film in the vicinity of an opening at which the film is formed. For example, as illustrated in FIG. 5, when a silicon oxide film 171B is present on the semiconductor substrate 11 during the step of etching the through hole 180H, the semiconductor substrate 11 will be side-etched in the vicinity of an opening end of the through-hole (TSV) 180H, and thus the vicinity of the opening end of the semiconductor substrate 11 at the second surface will have an under-cut shape. As a result, the shape of the opening in the vicinity of the opening end of the through-hole (TSV) 180H may be a so-called overhang shape in which the silicon oxide film 171B protrudes inwardly over the etched opening in the semiconductor substrate 11 in the vicinity of the opening end of the through-hole (TSV) 180H.

Figure 6:
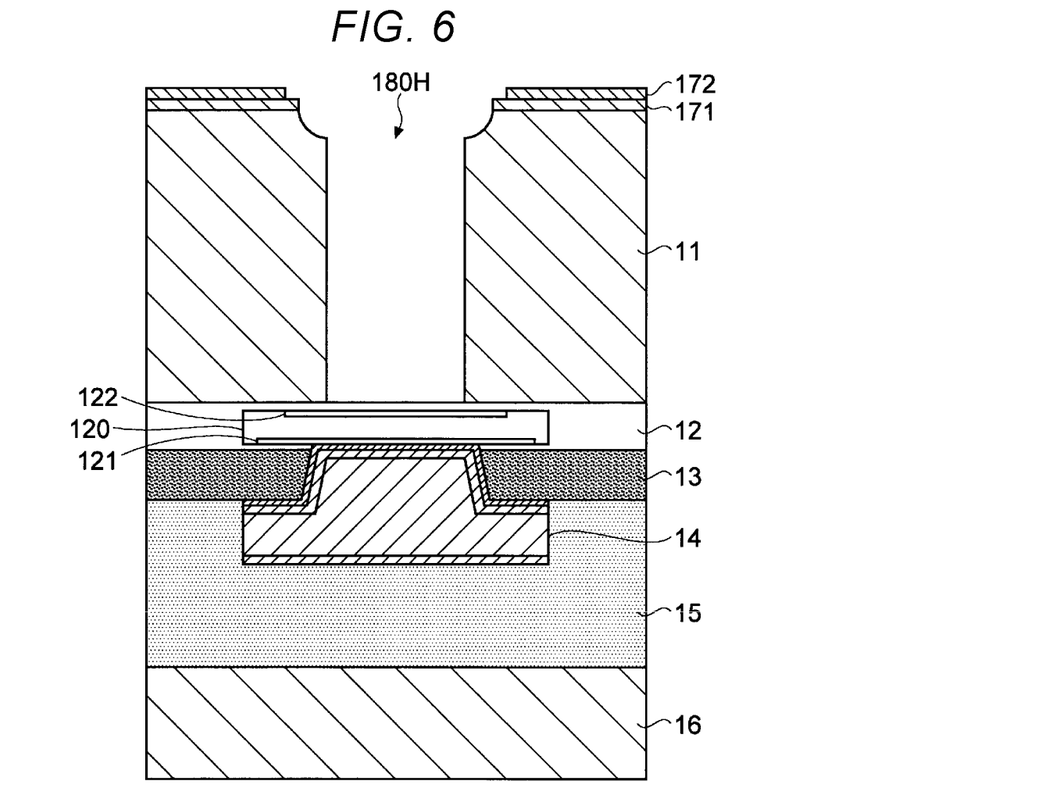
FIG. 6 is a process cross-sectional view (Part 5 thereof) illustrating the method of manufacturing the semiconductor device according to this embodiment.

Thereafter, in this embodiment, as illustrated in FIG. 6, the portion of the silicon oxide film 171B, which overhangs the portion of the through-hole (TSV) 180H in the semiconductor substrate 11 is removed. A dilute hydrofluoric acid and the like may be used for removal of the overhang portion of the silicon oxide film 171B. As a result, at the opening end of the through-hole (TSV) 180H, it is possible to cause the protrusion of the silicon oxide film 171 to retreat from or to the edge of the opening end of the semiconductor substrate 11. Further, the silicon oxide film 171 after the retreat may protrude from the opening end of the semiconductor substrate 11 to a certain extent that does not have an effect on formation of a subsequent silicon oxide film 173. That is, the opening diameter of the through-hole 180H, which is formed in the silicon oxide film 171, may be substantially the same as or greater than the opening diameter of the through-hole 180H that is formed in the semiconductor substrate 11. In addition, the silicon nitride film 172A on the silicon oxide film 171A has lower plasma resistance in comparison to the silicon oxide film 171A, and thus the overhang shape is less likely to occur, and thus the process of causing the silicon nitride film 172 in the vicinity of the opening end of the through-hole (TSV) 180H to retreat can be omitted.

Figure 7:
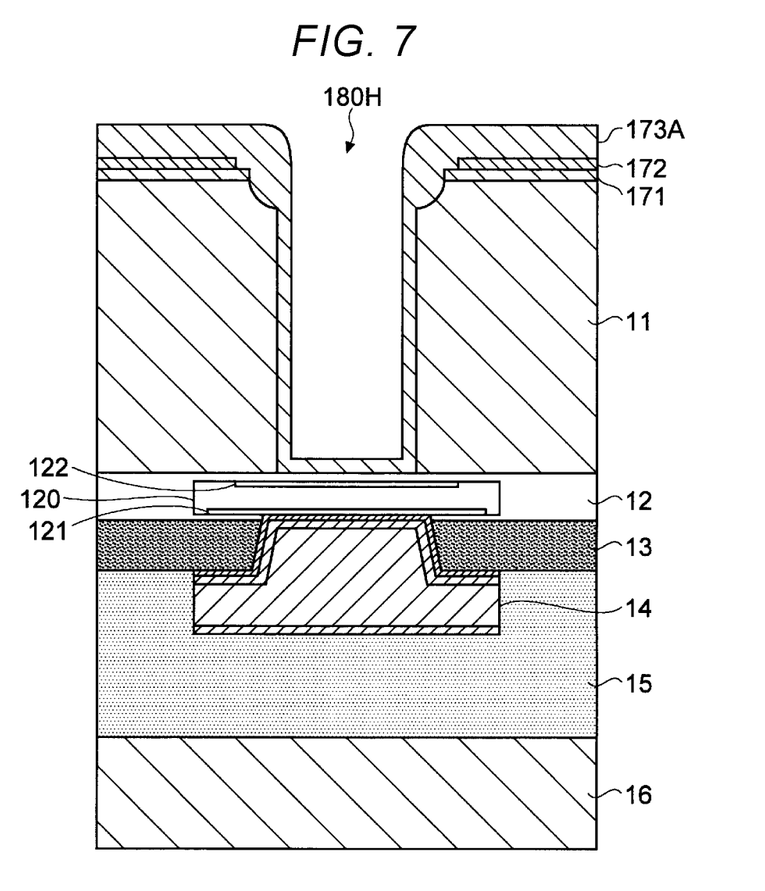
FIG. 7 is a process cross-sectional view (Part 6 thereof) illustrating the method of manufacturing the semiconductor device according to this embodiment.

Next, as illustrated in FIG. 7, a silicon oxide film 173B is formed on the entirety of the second surface of the semiconductor substrate 11 and on an inner surface of the through-hole (TSV) 180H. For formation of the silicon oxide film 173B, a CVD method and the like may be used. As described above, during formation of the silicon oxide film 173B, since the overhang, in which the silicon oxide film 171 protrudes from the semiconductor substrate 11 at the opening end of the through-hole (TSV) 180H, is reduced or removed, it is possible to reliably form the silicon oxide film 173 on an inner side surface of the through-hole (TSV) 180H.

Figure 8:
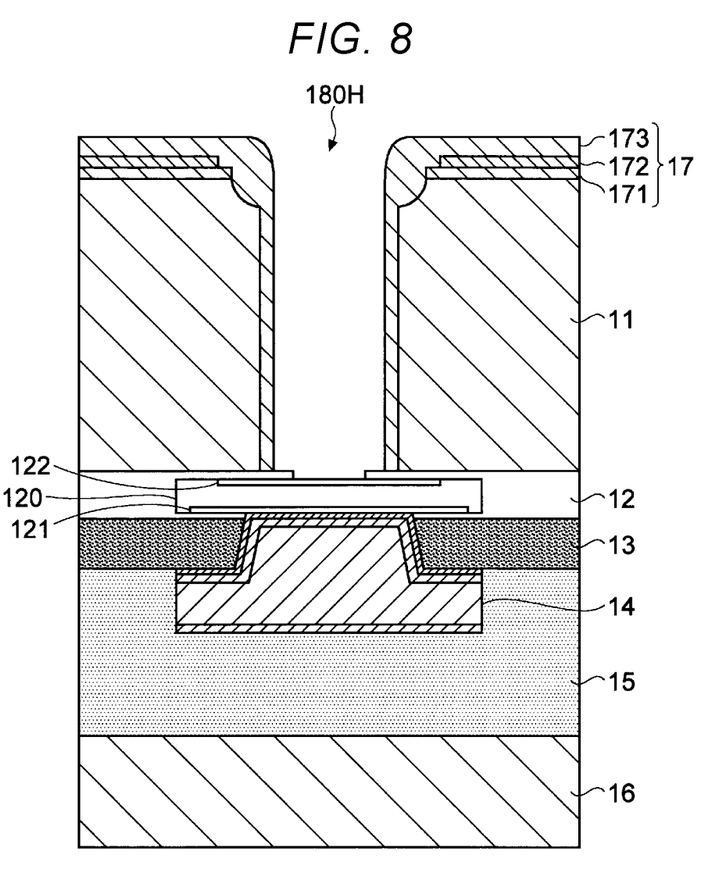
FIG. 8 is a process cross-sectional view (Part 7 thereof) illustrating the method of manufacturing the semiconductor device according to this embodiment.

Next, the portion of the silicon oxide film 173B formed on the bottom of the through-hole (TSV) 180H is etched-back to remove the silicon oxide film 173B on the bottom of the through-hole (TSV) 180H. The etching-back is carried out until the insulating film (this may include an interlayer insulating film, and may be referred to as a third insulating film) of the device layer 12 is removed, and thus the lower layer wiring 122 is exposed. As a result, as illustrated in FIG. 8, the three-layer insulating layer 17 including the silicon oxide film 171, the silicon nitride film 172, and the silicon oxide film 173 is formed on the second surface of the semiconductor substrate 11, and the inner side surface of the through-hole (TSV) 180H is covered with the silicon oxide film 173. Further, the lower layer wiring 122 of the device layer 12 is exposed to the bottom of the through-hole (TSV) 180H. Further, anisotropic dry etching and the like can be used for the etching-back of the silicon oxide film 173B.

Figure 9:
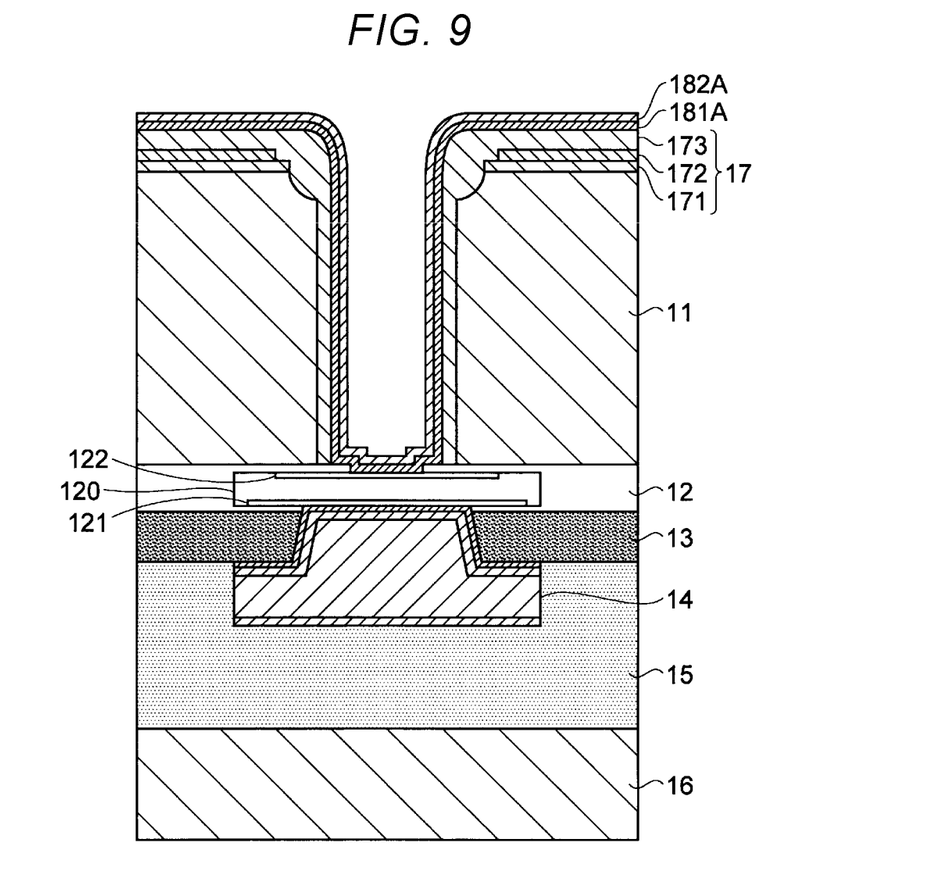
FIG. 9 is a process cross-sectional view (Part 8 thereof) illustrating the method of manufacturing the semiconductor device according to this embodiment.

Next, a barrier metal layer 181A using titanium (Ti) and a seed metal layer 182A using copper (Cu) are sequentially formed on the entirety of the insulating layer 17 and on the inner surface of the through-hole in the same manner as in formation of the barrier metal layer 141A and the seed metal layer 142A, thereby obtaining the cross-sectional structure illustrated in FIG. 9. The barrier metal layer 181A and the seed metal layer 182A may be simply referred to as a metal layer. The film thickness of the seed metal layer 182A may be greater than that of the seed metal layer 142A. Even in this process, since the overhang, by which the silicon oxide film 171 protrudes from the semiconductor substrate 11 at the opening end of the through-hole (TSV) 180H, is reduced or removed, it is possible to reliably form the barrier metal layer 141A and the seed metal layer 142A on the inner side surface of the through-hole (TSV) 180H.

Figure 10:
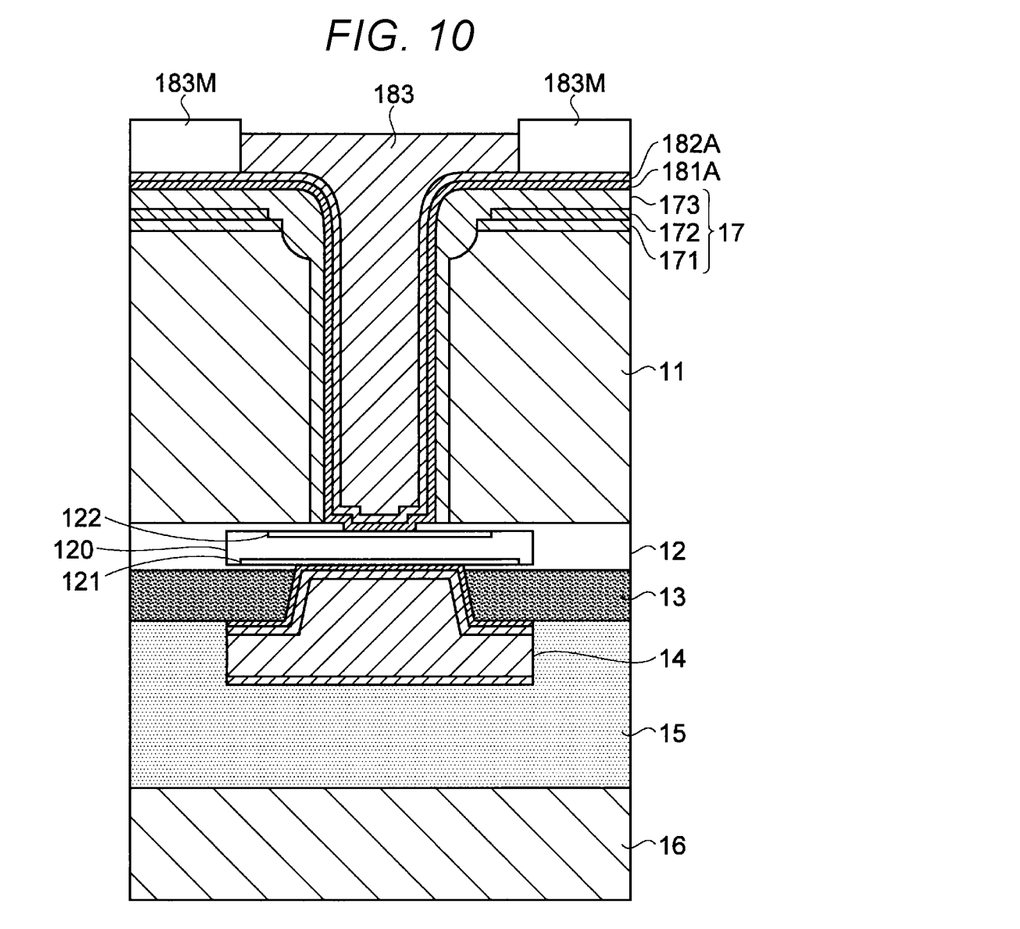
FIG. 10 is a process cross-sectional view (Part 9 thereof) illustrating the method of manufacturing the semiconductor device according to this embodiment.

Next, a mask 183M for formation of the through-electrode 183 is formed on the seed metal layer 182A, for example, using photolithographic techniques. An opening is formed at a position of the mask 183M which corresponds to the through-hole (TSV) 180H formed in the semiconductor substrate 11. Then, as illustrated in FIG. 10, the nickel (Ni) through-electrode 183 is formed on the seed metal layer 182A that is exposed from the opening of the mask 183M.

For formation of the through-electrode 183, conformal plating and the like may be used.

Next, after removal of the mask 183M, the exposed portions of the seed metal layer 182A and the barrier metal layer 181A are removed. For removal of the seed metal layer 182A and the barrier metal layer 181A, wet-etching may be used. At this time, the following etching conditions may be used. Specifically, under the etching condition, at least one of the seed metal layer 182 and the barrier metal layer 181, which remains without being etched, overlies at least one of the silicon oxide film 171 and the silicon nitride film 172 in the insulating layer 17.

Next, the joining material 19 is attached to an upper surface of the through-electrode 183 that protrudes from the insulating layer 17. For formation of the joining material 19, an electrolytic plating method, an electroless plating method, and the like may be used. Through the above-described processes, the second through-electrode 18, which extends out from the lower layer wiring 122 of the device layer 12 onto the insulating layer 17, is formed on the second surface side of the semiconductor layer 11, and thus the semiconductor device 1 having the cross-sectional structure illustrated in FIG. 1 is manufactured.

As described above, according to this embodiment, during formation of the insulating layer 17 that prevents the semiconductor substrate 11 and the second through-electrode 18 from being short-circuited, it is possible to reduce or remove the overhang in which the silicon oxide film 171 protrudes from the semiconductor substrate 11 at the opening end of the through-hole (TSV) 180H. According to this, it is possible to reliably form the silicon oxide film 173, the barrier metal layer 141, and the seed metal layer 142 on the inner side surface of the through-hole (TSV) 180H. That is, it is possible to reliably embed an insulating substance, a metal, and the like in the through-hole (TSV) 180H.

Further, in the above-described description, a stacked film of the silicon oxide film 171, the silicon nitride film 172, and the silicon oxide film 173 is exemplified as the insulating layer 17, but there is no limitation to the materials and the layer structures of these materials. That is, when using an insulating material, which has a relatively large etching selectivity with respect to the semiconductor substrate 11, for at least one of the silicon oxide film 171 and the silicon nitride film 172 in the insulating layer 17, this embodiment is applicable. For example, even when using a single-layer film of a silicon oxide film, a silicon nitride film, or a silicon oxynitride film (SiON), a stacked film of two or more thereof, and the like instead of the silicon oxide film 171 and the silicon nitride film 172 in the insulating layer 17, this embodiment is applicable.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
    a semiconductor substrate provided with a through-hole extending through the semiconductor substrate from a first surface to a second opposed surface of the substrate;
    a device layer, including a wiring, located on the first surface of the semiconductor substrate;
    an insulating layer covering the device layer;
    a first through-electrode extending through the insulating layer;
    a first insulating film located on the second surface of the semiconductor substrate, including an opening having an opening diameter that is substantially the same as or greater than an opening diameter of the through-hole of the semiconductor substrate;
    a second insulating film located on the first insulating film and on an inner side surface of the through-hole of the semiconductor substrate; and
    a second through-electrode electrically connected to the wiring in the device layer from an upper side of the second insulating film through the inside of the through-hole of the semiconductor substrate.

2. The semiconductor device according to claim 1, wherein the through hole has a first portion extending from the device layer in the direction of the second surface; and
    a second portion located between the first portion and the second surface of the semiconductor substrate, wherein the second portion has a larger diameter than the diameter of the first portion.

3. The semiconductor device according to claim 2, wherein the opening diameter of the first insulating film is substantially the same as or greater than the diameter of the second portion.

4. The semiconductor device according to claim 2, wherein the opening diameter of the first insulating film is greater than the diameter of the through hole at the device layer.

5. The semiconductor device according to claim 2, wherein the second through-electrode is exposed at the second surface of the semiconductor substrate, and a joining layer is located on the exposed surface of the second through electrode.

6. The semiconductor device of claim 1, wherein the second through electrode overlies a portion of the first insulating film.

7. The semiconductor device according to claim 6, further comprising a seed layer interposed between the second through electrode and the second insulating film, and overlying at least a portion of the first overlying film.

* * * * *